United States Patent [19]

Alongi et al.

[11] Patent Number: 4,504,967

[45] Date of Patent: Mar. 12, 1985

[54] METHOD AND APPARATUS FOR DAMPING SPURIOUS VIBRATION IN SPRING REVERBERATION UNITS

[75] Inventors: C. J. Alongi; Jack L. Miller; William W. Radzik, all of St. Charles, Ill.

[73] Assignee: The Marmon Group, Inc., Chicago, Ill.

[21] Appl. No.: 450,325

[22] Filed: Dec. 16, 1982

[51] Int. Cl.³ ........................ H03G 3/00; H04B 15/00

[52] U.S. Cl. ........................................ 381/65; 381/93; 84/DIG. 26; 333/146; 181/202

[58] Field of Search ........................ 381/61, 62, 63, 64, 381/65, 83, 88, 93; 179/180; 181/151, 202, 207, 208, 296; 84/DIG. 26; 333/146

[56] References Cited

U.S. PATENT DOCUMENTS

| | | | |
|---|---|---|---|
| 2,580,690 | 1/1952 | Merklinger | 381/83 X |
| 3,106,610 | 10/1963 | Young | 381/65 |
| 3,286,204 | 11/1966 | Laube, Jr. | 333/146 |
| 4,215,763 | 8/1980 | Pasko | 181/202 |

*Primary Examiner*—Keith E. George
*Attorney, Agent, or Firm*—Neuman, Williams, Anderson & Olson

[57] ABSTRACT

A method of determining the physical location of undesired resonance zones induced by acoustic feedback in a spring reverberation unit and damping the vibration of these resonance zones. The improved spring reverberation unit with damping material located at the resonance points of the unit produces a reverberated audio signal which is substantially free from the screeching and howling caused by acoustic feedback.

28 Claims, 5 Drawing Figures

METHOD AND APPARATUS FOR DAMPING SPURIOUS VIBRATION IN SPRING REVERBERATION UNITS

BACKGROUND OF INVENTION

1. Field of the Invention

The present invention is directed to a method of determining the physical location of undesired resonance points or zones induced by acoustic feedback in a spring reverberation unit and to an improved spring reverberation unit in which this acoustical feedback is substantially eliminated.

2. Prior Art

Spring reverberation units have been used in electronic musical instruments and sound systems for many years. In its simplest form, a spring reverberation unit comprises an electro-mechanical transducer connected to one end of a spring and a mechanical-electrical transducer connected to the other end of the spring. This transducer-spring assembly is mounted inside a U-shaped housing or channel. This U-shaped inner channel is mounted by suspension springs to an outer U-shaped housing. A portion of the electrical signal representative of the audio signal is applied to the electro-mechanical transducer which translates the electrical signal to a mechanical movement of the spring. The mechanical-electrical transducer at the opposite end of the spring converts the mechanical movement of the spring back into an electrical signal. This converted electrical signal, the reverberated signal, is delayed in time by an amount proportionate to the length of the spring and other secondary factors.

In a typical sound system the reverberated signal is combined with the unreverberated electrical signal representative of the audio signal and the combined signal is applied to an output device such as a loudspeaker. The resulting audio signal simulates the type of audio signal that would be produced in a concert hall in which the sound reaching the listener arrives at different times due to reflections from walls and other solid objects.

Spring reverberator units are responsive not only to the proper electrical signal input but also to other ambient conditions which cause the spring to vibrate. The spring of the reverberation unit is typically mounted within a housing or inner channel which is in turn mounted by suspension springs to an outer housing or channel to isolate the spring from spurious vibration caused by external physical movement of the unit. The outer housing or channel is typically secured by screws or other means to some portion of the sound system, but because of the compact nature of the sound systems the reverberation unit is usually in close physical proximity to the sound transducer. Therefore, the principal cause of spurious vibrations in the spring is acoustical feedback from the sound output device, loudspeaker, which causes both the inner and outer housings to resonate, thereby imparting a resonant movement to the spring itself. The spring itself is typically immune to such undesired resonance since the pressure waves created by the sound transducer do not impact the comparatively small cross-sectional area of the spring with sufficient force to cause vibration. The greatest portion of the pressure waves impact upon the surface of the outer channel causing it to resonate. Since the outer channel is in close proximity to the inner channel and is air coupled thereto the movement of the outer channel impacts movement to the inner channel. In addition, the inner channel is also impacted, to a much lesser degree than the outer channel, by the pressure waves from the loud speaker. These pressure waves together with the air coupled movement of the outer channel forces the inner channel to resonate. This complicated interaction between the pressure waves from the loudspeaker impacting the inner and outer housing and the air coupling between the inner and the outer housing causes the spring to move thereby introducing spurious signals into the system.

When the induced resonance in the inner and outer housings is sufficiently large, it causes the spring to vibrate at such a rate that the oscillation of the spring becomes self-sustaining. While any movement of the spring which is not the direct result of the input signal to the electro-mechanical transducer causes distortion of the reverberated signal, the self-sustained oscillation of the spring is particularly detrimental and causes a significant spurious output signal from the spring reverberation unit which manifests itself as a screeching or howling in the audio signal. The undesirable self-sustaining oscillation of the spring can be induced by the pressure waves from the sound transducer impacting upon the surface of the outer housing of the reverberation unit even though no electrical signal input is received by the electro-mechanical transducer of the spring reverberation unit. The screeching or howling in the audio output is extremely disquieting to the listener.

Spring reverberation units of the type discussed herein are best described in U.S. Pat. No. 3,106,610 which issued to Alan Young on Oct. 8, 1963. The Young patent is incorporated herein by reference to describe in detail what is frequently referred to as the standard spring reverberation unit.

At least one attempt has been made in the prior art to eliminate the acoustic feedback from the sound transducer which induces reasonance in the inner and outer channels of the spring reverberation unit with the resulting spurious oscillations of the spring and the howling in the audio output. This prior art solution was to encase the entire spring reverberation unit within a sack made from vinyl or similar material in an effort to block or reduce the acoustical pressure waves before they impacted upon the inner and outer housing of the spring reverberation unit. This attempted solution was not only cumbersome in manufacture and costly, but also failed to effectively eliminate the acoustical feedback from the output transducer.

SUMMARY OF INVENTION

The most well known and widely used spring reverberation unit comprises at least one spring, an electro-mechanical transducer connected to one end of the spring and a mechanical-electrical transducer connected to the other spring end. The spring and the transducers are mounted within an inner housing or channel. The inner channel is then suspended by springs to an outer housing or channel. The spring reverberation unit is mounted by attaching the outer channel to the electronic musical instrument or sound system usually in close proximity to the output sound transducer.

The acoustical feedback from the overall sound system causes the inner and outer channel to vibrate at particular points, hereinafter referred to as natural resonance points or zones. This vibration causes relative movement between the spring and the transducers which causes a spurious output signal resulting in a screeching or howling noise in the audio output signal.

In order to eliminate the screech or howl in the audio output signal, the resonance points in both the outer and inner channels must be located and then damped. The present invention discloses two fundamental ways to determine the resonance points in the inner and/or outer channel.

The typical construction of most spring reverberating units causes the outer channel to effectively screen the inner channel from most of the direct impact of the acoustical pressure waves from the loudspeaker. This occurs because the outer channel essentially envelopes the inner channel which is suspended inside the outer channel by several springs. Such an arrangement leaves a cushion of air between the outer and inner channels. Consequently, most of the resonance induced in the inner channel is transferred to the inner channel from the vibration of the cushion of air separating the two channels. This vibration is caused by the resonating excitation of the outer channel.

This shielding and subsequent partial transferring of the impacting acoustical pressure waves by the outer channel requires the locating of the resonance zones of that channel and the appropriate damping of them before the inner channel is damped. This is necessary because damping the outer channel reduces the resonance of that channel, thereby reducing its subsequent excitation of the air cushion separating the two channels, thus effectively reducing the resonance of the inner channel without even damping it. The inner channel can then be damped to the degree desired to bring the performance of the spring reverberation unit within a final acceptance range.

The first method is referred to as an active method. In this method, the amount of amplifier gain needed to drive the reveberation system into sustained oscillation is used as the standard of comparison, the higher the gain, the more stable and immune to acoustical feedback is the reverberation unit. In this method, there is no input to the reverberation unit and the output is applied through a variable gain unit then back through the circuitry of the sound system. In most circumstances due to the close proximity of the reverberation unit to the loudspeaker the low level noise signals in the system cause sufficient coupling to the reverberation unit to initiate oscillation in the reverberation unit. However, if this coupling is not adequate, then an input signal is applied to the sound system causing an acoustic output signal which impacts upon the reverberation unit. The reverberation unit will begin to vibrate at its nautral resonance points or zones. The input signal is now discontinued and the variable gain is increased to the point of forcing the reverberator unit into sustained self-oscillation. Now, two pieces of damping material, each approximately one inch square, are placed at symmetrical locations upon the outer channel. The variable gain is again increased to the level at which sustained self-oscillation occurs in the spring reverberation unit. The two pieces of damping material are now moved a uniform amount, preferably approximately about one-half inch relative to one another and the variable gain is increased until sustained self-oscillation of the spring reverberation unit again occurs. This sequence is repeated, again moving the two squares of damping material a uniform amount and varying the gain until the spring reverberation unit is driven into sustained self-oscillation. The locations of damping material which result in the maximum gain before sustained self-oscillation are the resonance points or zones of the outer housing. Now, damping material of a slightly larger size is placed at these zones and the gain increased until sustained self-oscillation is again induced in the spring reverberation unit. This procedure is again repeated, increasing the size of the damping pads until the desired level of gain (resistance to acoustic feedback) is achieved. The same procedure is now repeated for the inner channel.

The passive method of determining the zones or resonance points requires driving the spring reverberation unit to sustained self-oscillation and then sprinkling a granular material such as sawdust upon the surface of the outer housing. The sawdust is vibrated until it moves to a point of no vibration on the housing surface. The evacuated areas where no sawdust remains are the resonance points or zones of the housing. Now, a small segment of damping material is placed at each zone and the gain is increased to the point of sustaining self-oscillation. Now, the size of the damping pad is increased and the gain increased until the spring reverberation unit is again driven to sustained self-oscillation. This is repeated until the size of the damping pads is determined as corresponding to those which provide the desirable level of isolation from acoustic feedback as measured by the amount of needed gain. The same procedure may now be repeated for the inner channel, providing the vibration excursions of the material used in the construction of the inner channel are of a sufficient magnitude to cause displacement of the granular material and providing that the physical location of the inner channel is accessible for conducting the test.

The active and passive methods can be used together for any spring reverberation unit, the active method on one channel and the passive method on the other. Under some circumstances the physical access to the channel or the frequency of the resonance points will dictate that the active method be used instead of the passive method. Thus, the active or passive methods can be combined to achieve the same end result.

The improved spring reverberation unit has damping material adhered to the points of resonance of the inner and outer housing or channel, the damping material being of a size determined to provide a desired level of isolation to acoustic feedback. Both the location of the resonance points and the size of the damping material are determined by the active or passive methods described above.

DETAILED DESCRIPTON

Sound reverberation is commonly provided in electronic musical instruments and sound systems to simulate the acoustical effects of a large auditorium or concert hall in a much smaller listening area. In the concert hall or other similar large listening areas, sounds reach the listener both by a direct unimpeded transmission path and by reflection from all the various surfaces within the area. These reflected signals are attenuated in varying amounts due to the nature and characteristics of the reflecting surfaces and since each reflected sound wave travels a different distance to reach the listener each is delayed a different amount of time. All of these acoustic signals, both direct and reflected, blend together for a full, pleasing sound for listeners.

Figure 1:
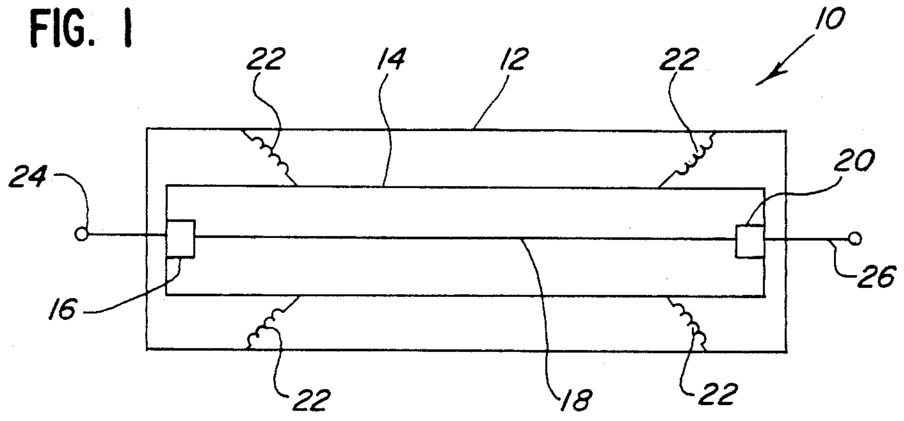
FIG. 1 shows a standard spring reverbation unit.

FIG. 1 shows a standard spring reverberation unit, of the kind disclosed in U.S. Pat. No. 3,106,610, issued to Alan Young on Oct. 8, 1963. The spring reverberation unit 10 comprises a U-shaped outer housing or channel 12, a U-shaped inner housing or channel 14, a electro-mechanical transducer 16 connected to one end of spring 18 and a mechanical-electrical transducer 20 connected to the opposite end of spring 18. The outer channel 12 and the inner channel 14 are typically made of metal but other materials can be used. The spring and transducer assemblies are mounted within the inner channel 14. The inner channel 14 is mounted within the outer channel 12 by a group of suspension springs 22.

An electrical signal commonly representing a musical sound or tone is applied via input lead 24 to the electro-mechanical transducer 16. The electro-mechanical transducer 16 imparts a torsional force to the spring 18. This torsional force traverses the length of the spring 18 and is converted back into an electrical signal by mechanical-electrical transducer 20. The output signal from mechanical-electrical transducer 20 on output lead 26 represents the same musical sound or tone signal applied to input lead 24 but delayed by an amount of time needed by the spring 18 to transmit the signal along its length. Of course, more complicated spring reverberation units containing two or more springs of different lengths are well-known in the art.

Figure 2:
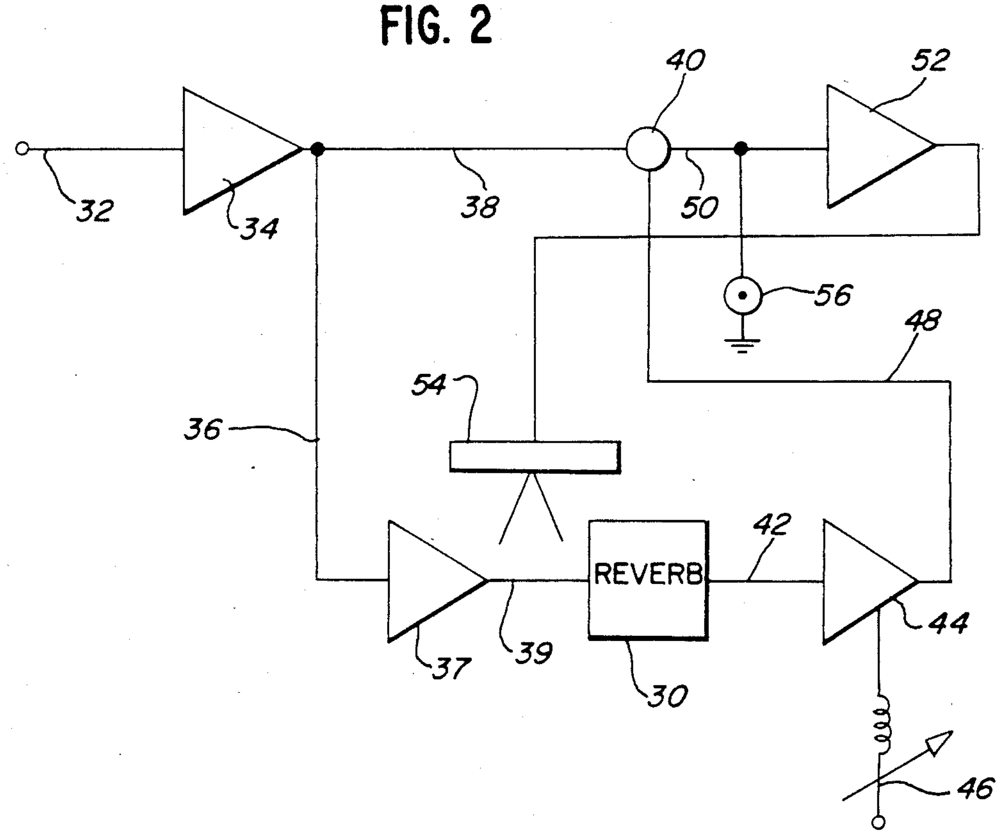
FIG. 2 shows the schematic for a typical sound system with a reverberation unit.

FIG. 2 shows a typical schematic for a sound system having a sound reverberation unit 30. An electrical signal, usually representing a musical tone, is present on lead 32 and is applied to an amplifier 34. The amplified electrical signal from the output of amplifier 34 is applied via line 36 to the input of reverberation driver unit 37. The output of driver 37 is applied via line 39 to the input of reverberation unit 30. In addition, the amplified electrical output signal from amplifier 34 is applied via line 38 to the summation circuit 40. The reverberation unit 30 operates as described above with reference to FIG. 1. The reverberated output signal on line 42 is applied to amplifier 44 which has an adjustable gain control 46 to vary the percentage amount of reverberated signal present on line 48. The reverberated output signal on line 48 is combined with the unreverberated signal on line 38 in summation circuit 40. The combined signal from summation circuit 40 is applied on line 50 to a power amplifier 52 and then to sound transducer 54. In addition, sound systems are provided with output jacks at various places to obtain the signal from that location for other purposes. Such an output jack 56 is shown connected to line 50 to receive the combined signal from the summation circuit 40. The transducer 54 converts the combined electrical signal into acoustic sound waves heard by the listener.

It should be apparent to one of ordinary skill in the art that the circuit schematic shown in FIG. 2 does not include many signal conditioning and amplifying circuits that would be present in an actual system. However, these circuits have been deleted since they are not necessary to the understanding of the present invention.

A major difficulty with standard spring reverberation units as shown in FIG. 1 is acoustic feedback. As represented in FIG. 2, the spring reverberation unit 30 is usually placed in close proximity to the sound transducer 54 due to the physical requirements surrounding its use. As a result of this close placement, the acoustic waves produced by the transducer impact the outer and inner channels 12 and 14 of the spring reverberation unit 10 as shown in FIG. 1. The outer and inner channels for the spring reverberation unit physically resonate due to the acoustic feedback. This resonance causes the housings to move in relation to the spring 18 which results in a spurious signal being produced at the spring output transducer 20. This spurious output signal causes a howling or screeching in the audio output. In order to eliminate the spurious output signal of the spring reverberation unit these resonance points must be located and effectively damped.

The typical construction of most spring reverberating units as shown in FIG. 1 causes the outer channel 12 to effectively screen the inner channel 14 from most of the direct impact of the acoustical pressure waves from the loudspeaker. This occurs because the outer channel 12 25 essentially envelops the inner channel 14 which is suspended inside the outer channel by several springs 22. Such an arrangement leaves a cushion of air between the outer and inner channels. Consequently, most of the resonance induced in the inner channel 14 is transferred to the inner channel from the vibration of the cushion of air separating the two channels. This vibration is caused by the resonating excitation of the outer channel 12.

This shielding and subsequent partial transferring of the impacting acoustical pressure waves by the outer channel 12 requires the locating of the resonance zones of that channel and the appropriate damping of them before the inner channel 14 is damped. This is necessary because damping the outer channel 12 reduces the resonance of that channel, thereby reducing its subsequent excitation of the air cushion separating the two channels, thus effectively reducing the resonance of the inner channel 14 without even damping it. The inner channel 14 can then be damped to the degree desired to bring the performance of the spring reverberation unit within a final acceptance range. If the entire surface of the outer and inner channels 12 and 14 of the spring reverberation unit 10 is damped, for example, by applying sound damping material across the entire surface area, the physical operating characteristics of the spring reverberation unit are adversely affected. When the entire surface area is covered after the unit is produced, a weighting overload effect occurs which causes the unit to bottom out actually striking or contacting the surface to which the reverberation unit is mounted. This bottoming out interferes with the audio signal in its vibrational mode from traveling along the spring as well or as truly as before, causing the unit to output inaccurate reconstructions of the input signal. In addition, the bottoming out causes spurious signals in the output of the reverberation unit causing unwanted audio output signals. In order to minimize these problems, the entire suspension system of the reverberation unit would have to be redesigned to compensate for the added weight of the sound damping material. However, even if the unit is redesigned, it is uncertain that the performance characteristics will be as favorable as those of a unit having only the necessary damping material attached. In addition, this indiscriminate use of sound damping material is costly.

The method of the present invention locates the zones or points of resonance of the outer and inner housings of the spring reverberation unit and then places sound absorbing or damping material at these specific points. Furthermore, the size of the sound absorbing material is varied to provide the most desirable isolation from acoustic feedback balanced against cost of the material and any adverse effect upon the operation of the unit caused by the weight of the sound damping material.

The present invention discloses two methods for determining the resonance points or zones of both the outer channel and the inner channel of the standard spring reverberation unit. The first method is referred to as an active method and the second as passive. These methods may be used separately or in combination for the inner and outer channels of the spring reverberation unit.

Figure 3:
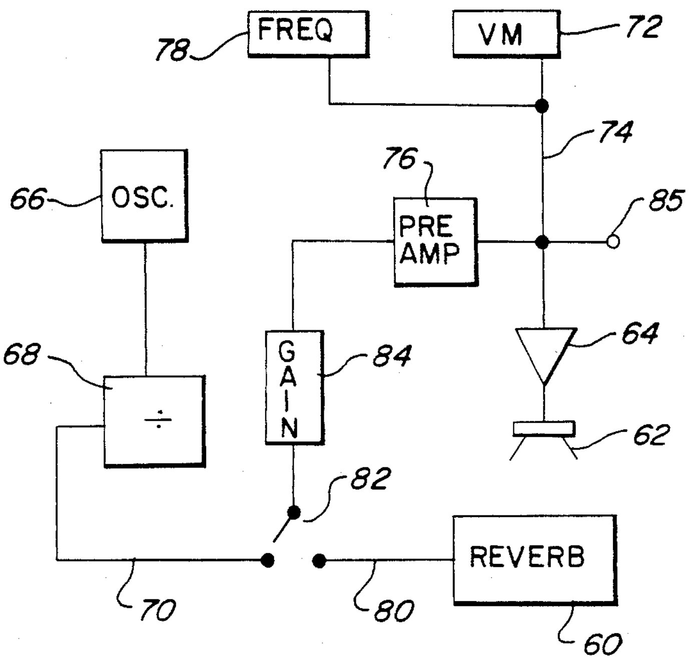
FIG. 3 shows the schematic circuit for performing the active method of locating zones or resonance points in a spring reverberation unit caused by acoustical feedback.

The circuit used for practicing the active method is shown in FIG. 3. In this method the standard spring reverberation unit 60 is placed in the normal location in close proximity to the sound transducer 62 and power amplifier 64. A reference oscillator 66 with a 1 volt output signal is applied to a precision divider 68 to provide a 1 mv calibrated signal on line 70. The calibrated 1 mv signal on line 70 is applied via switch 82 to an adjustable gain circuit 84. The signal from the gain circuit 84 is applied to the sound system pre-amp 76 which has a fixed gain. A digital voltmeter 72 is connected via line 74 to the output point of preamplifier 76. Such an output can be obtained from the jack 56 shown in FIG. 2. A frequency counter 78 is also connected to line 74. The digital voltmeter 72 displays the value equal to the 1 mv calibrated signal times the fixed gain of pre-amplifier 76 and any gain of gain circuit 84. The frequency of this signal is displayed upon the frequency counter 78.

The output of the spring reverberation unit 60 on line 80 is connected via switch 82 to the variable gain circuit 84. There is no electrical signal input applied to the spring reverberation unit 60 since this evaluation is only concerned with acoustic feedback. The sound system is turned on, and, if necessary, the electrical signal is applied at line 85 to the power amplifier 64 and transducer 62. Acoustic pressure waves now impact upon the spring reverberation unit which cause vibration, as discussed above. Once vibration of the reverberation unit is initiated, the electrical signal at line 85, if initially used, is discontinued. The switch 82 is connected to line 80 so that the output of the reverberation unit caused by the acoustic feedback is applied to the input of gain circuit 84. The output of the gain circuit 84 is applied through the pre-amp 76 in the normal manner. The gain circuit 84 is now increased in gain until the spring reverberation unit is driven into sustained oscillation by the sound transducer 62 and monitored by voltmeter 72.

Now switch 82 is connected to receive the calibrated 1 mv signal on line 70 which is then applied to the gain circuit 84. The setting of gain circuit 84 is not changed from the setting which caused the sustained self oscillation. The output of the gain circuit 84 is applied to the preamplifier 76 and the output of the preamplifier 76 is applied to the digital voltmeter 72 and frequency counter 78 via line 74.

The value displayed on the digital voltmeter 72 is equal to the 1 mv calibrated signal times the fixed gain of pre-amplifier 76 and the variable gain of gain circuit 84. The resistance of the reverberation unit 60 to acoustic feedback is related to the gain setting needed to drive the signal into sustained self oscillation. The higher the gain setting the more resistant the reverberation unit is to acoustic feedback The oscillator 66, divider 68, switch 82, gain circuit 84 and voltmeter 72 form a calibrated gain circuit. The amount of gain introduced by circuit 84 is determined by reading the value of voltmeter 72.

It should be obvious to one of ordinary skill in the art that a calibrated gain circuit which provides a read-out of its own gain could be substituted for this circuit.

Now, since the standard spring reverberation unit 60 is symmetrical in structure, two one-inch pads of sound damping material are placed at each end of the unit. The above-described step is now repeated and the amount of gain introduced by circuit 84 which is now needed to drive the spring reverberation unit into sustained self-oscillation is determined. Next, the two pads of sound damping material are moved closer together by a predetermined amount, in the preferred embodiment one-half inch and the gain of circuit 84 is again increased to determine the amount of additional gain necessary to drive the spring reverberation unit into sustained self-oscillation. This procedure is repeated until the location of the sound damping pads is determined which results in the gain induced by circuit 84 being at the maximum value. This location of the sound damping pads corresponds to the zones or resonance points of the outer channel of the spring reverberation unit 60.

Once the location of the zones or resonance points are determined the most effective size of the sound damping pads must also be determined. The same procedure as described above is repeated, but the location of the pads remains fixed while the size or thickness of the pads is progressively increased. The size and thickness of the pads which permits the greatest gain in circuit 84 is the optimum size pad. Since the size of the pads could theoretically grow to counteract the amount of gain in circuit 84 until the pad was as large as the entire surface of the outer channel in determining the optimum practical size of the pads, the amount of isolation from acoustic feedback which is desired must be balanced against the cost of the pads and the adverse affects to the operation of the reverberation unit by the weight of the sound damping pads.

Once the location and size of the sound damping pads for the outer channel are determined and placed on the unit, the same procedure is repeated for the inner channel. The result is a standard spring reverberation unit with sound damping pads located at the zones or resonance points caused by acoustic feedback in both the outer and inner channel.

Figure 4:
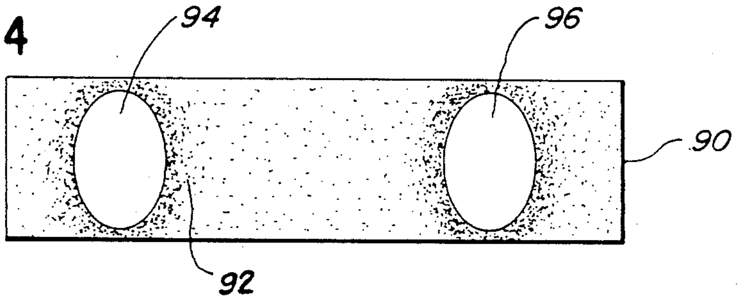
FIG. 4 shows a typical zone or resonance pattern produced during the passive method of locating zones or resonance points in a spring reverberation unit caused by acoustical feedback.

The passive method of locating the resonance points relies upon the actual vibration of the channel itself. In this method, sawdust or a similar fine granular substance is sprinkled upon the housing and the spring reverberation unit is driven to sustained self-oscillation. After the spring reverberation unit oscillates for a period of time the sawdust migrates to the area of least vibration. This migration of the sawdust leaves evacuated areas on the spring reverberation unit which correspond to the zones or resonance points. FIG. 4 illustrates a typical sawdust pattern for the outer channel of a spring reverberation unit 90. The sawdust 92 has shifted to the area of least vibration leaving substantially clean areas 94 and 96.

Once the zones or resonance points on the spring reverberation unit are determined, the sound damping pads are placed and the steps described above in the active method are used to determine the most effective size for the pads. Of course, the same procedure is then repeated for the inner channel.

Both the active and passive method can be used in cooperation with each other to determine the location of zones or resonance points depending in part upon the accessibility of the surface involved and the frequency of the resonance parts. Therefore, the active method could be used for both the outer and inner channel; the passive method could be used for both the outer and inner channel; the active method could be used for the outer channel and the passive method for the inner channel; or the passive method could be used for the outer channel and the active method for the inner channel.

Figure 5:
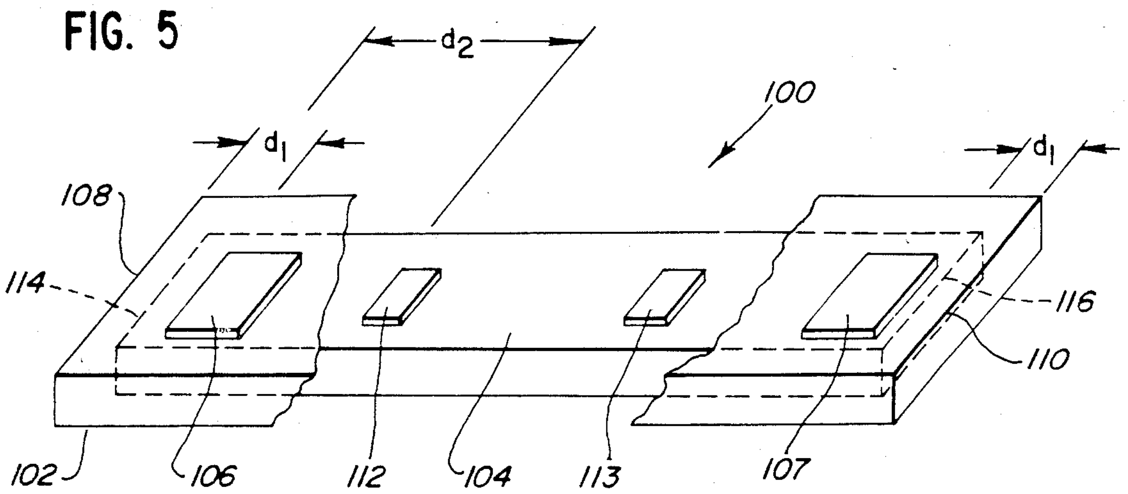
FIG. 5 shows a cutaway perspective view of the improved spring reverberation unit with damping material placed at the zones or resonance points on the inner and outer housing to obtain effective elimination of spurious vibration induced by acoustical feedback.

FIG. 5 illustrates a cut away perspective view of the improved spring reverberation unit of the present invention. The spring reverberation unit 100 has an outer housing or channel 102 and an inner housing or channel 104. After following either the active or passive method described above, the location and size of the sound damping pads is determined for both the outer and inner channels. Now, sound damping material 106 and 107 of the desired size is placed upon the outer channel at the proper location. For example, a pad 106 is placed equidistant from the sides of the outer channel 102 and at a distance $d_1$ from the end edge 108. Similarly, pad 107 is placed equidistant from the sides of the outer channel and at a distance $d_1$ from the end edge 110. Sound damping pads 112 and 113 of the desired size are also placed upon the inner channel at the proper location. For example, pad 112 is placed equidistant from the sides of the inner channel 104 and at a distance $d_2$ from the end edge 114. Similarly, pad 113 is placed equidistant from the sides of the inner channel 104 and at a distance $d_2$ from the end edge 116. The size of the pads is determined as a compromise between cost and effective resonance reduction as described above. The distances $d_1$ and $d_2$ shown in FIG. 5 for each of the pads are those distances previously determined so as to place the pads at the resonance points or zones, effectively damping the resonance of the improved spring reverberation unit caused by acoustic feedback.

It should be understood that the drawings are not necessarily to scale and that the embodiments are illustrated by graphic symbols, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

What is claimed is:

1. A method for locating and damping resonant zones caused by acoustic feedback in a spring reverberation unit having a housing comprising the steps of:

(a) placing said spring reverberation unit in an environment so that acoustic pressure waves impact upon said unit causing an output signal from said unit;

(b) increasing the gain of said output signal from said spring reverberation unit until said unit is driven to a state of self sustaining oscillation;

(c) measuring the level of gain necessary in step (b);

(d) placing sound damping material onto said housing;

(e) increasing the gain of said output signal from said spring reverberation unit until said unit is again driven to a state of self sustaining oscillation;

(f) measuring the level of gain necessary in step (e);

(g) changing the location of said sound damping material on said housing of said spring reverberation unit;

(h) repeating steps (e), (f), and (g);

(i) placing said sound damping material at the location at which the level of gain of said output signal from said spring reverberation unit was greatest.

2. The method as set forth in claim 1 further comprising the steps of:

(j) replacing said sound damping material with different sound damping material having a slightly larger volume;

(k) increasing the gain of said output signal from said spring reverberation unit until said unit is again driven to a state of self-sustaining oscillation;

(l) Measuring the level of gain necessary in step (k);

(m) repeating steps (j) through (l) with sound damping material having successively larger volumes until the sound damping material reaches a size which results in the maximum gain before inducing self-sustained oscillation of said spring reverberation unit and without adversely affecting the operation of said spring reverberation unit;

(n) placing said damping material having the size determined in step (m) at said location where the level of the gain of said output signal from said spring reverberation unit was greatest as determined in step (i).

3. A method as set forth in claim 2 wherein said housing has an inner channel and an outer channel and in which the method steps of claim 2 are used seratim to locate and damp the resonant zones caused by acoustic feedback first in said outer channel and then in said inner channel.

4. A method as set forth in claim 2 wherein said housing has an inner channel and an outer channel and in which the method steps of claim 2 are used to locate and damp the resonant zones caused by acoustic feeback in said outer channel and whrein the resonant zones caused by acoustic feedback are located and damped in said inner channel by following the steps of:

(o) placing said spring reverberation unit in an environment so that acoustic pressure waves impact upon said unit causing an output signal from said unit;

(p) increasing the gain of said output signal from said spring reverberation unit until said unit is driven to a state of self sustaining oscillation;

(q) measuring the level of gain necessary in step (p);

(r) placing sound damping material onto said inner channel;

(s) increasing the gain of said output signal from said spring reverberation unit until said unit is again driven to a state of self sustaining oscillation;

(t) measuring the level of gain necessary in step (s);

(u) changing the location of said sound damping material on said inner channel of said spring reverberation unit;

(v) repeating steps (s), (t) and (u);

(w) placing said sound damping material at the location at which the level of gain of said output signal from said spring reverberation unit was greatest.

5. A method as set forth in claim 1 wherein said housing has an inner channel and an outer channel and in which the method steps of claim 1 are used to locate and damp the resonant zones caused by acoustic feedback first in said outer channel and then in said inner channel.

6. A method as set forth in claim 1 wherein said housing has an inner channel and an outer channel and in which the method steps of claim 1 are used to locate and damp the resonant zones caused by acoustic feedback first in said outer channel and then in said inner channel with the steps for said inner channel further comprising:

(j) replacing said sound damping material with different sound damping material having a slightly larger volume;

(k) increasing the gain of said output signal from said spring reverberation unit until said unit is again driven to a state of self-sustaining oscillation;

(l) measuring the level of gain necessary in step (k);

(m) repeating steps (j) through (l) with sound damping material having successively larger volumes until the sound damping material reaches a size which results in the maximum gain before inducing self-sustained oscillation of said spring reverberation unit and without adversely affecting the operation of said spring reverberation unit;

(n) placing said damping material having the size determined in step (m) at said location where the level of the gain of said output signal from said spring reverberation unit was the greatest as determined in step (i).

7. A method for locating and damping resonant zones caused by acoustic feedback in a spring reverberation system having a housing comprising the steps of:

(a) covering the surface of said housing with a fine granular substance;

(b) placing said spring reverberation unit is an environment so that acoustic pressure waves impact upon said unit causing an output signal from said unit;

(c) increasing the gain of said output signal from said spring reverberation unit until said unit is driven to a state of self sustaining oscillation;

(d) determining the resonant zones of said spring reverberation unit by locating those areas of said housing which have been evacuated of said fine granular substance after a period of self sustaining oscillation of said unit;

(e) placing sound damping material on said housing at said resonant zones located in step (d);

8. The method as set forth in claim 7 further comprising the steps of:

(f) replacing said sound damping material with different sound damping material having a slightly larger volume;

(g) increasing the gain of said output signal from said spring reverberation unit until said unit is driven to a state of self-sustaining oscillation;

(h) measuring the level of gain necessary in step (g);

(i) repeating steps (f) through (h) with sound damping material having successively larger volumes until the sound damping material reaches a size which results in the maximum gain before inducing self-sustained oscillation of said spring reverberation unit and without adversely affecting the operation of said spring reverberation unit;

(j) placing said sound damping material having the size determined in step (i) at said locations determined in step (d).

9. A method as set forth in claim 8 wherein said housing has an inner channel and an outer channel and in which the method steps of claim 8 are used to locate and damp the resonant zones caused by acoustic feedback first in said outer channel and then in said inner channel.

10. A method as set forth in claim 8 wherein said housing has an inner channel and an outer channel and in which the method steps of claim 8 are used to locate and damp the resonant zones caused by acoustic feedback in said outer channel and wherein the resonant zones caused by acoustic feedback are located and damped in said inner channel by following the steps of:

(k) covering the surface of said inner channel with a fine granular substance;

(l) placing said spring reverberation unit in an environment so that acoustic pressure waves impact upon said unit causing an output signal from said unit;

(m) increasing the gain of said output signal from said spring reverberation unit until said unit is driven to a state of self sustaining oscillation;

(n) determining the resonant zones of said spring reverberation unit by locating those areas of said inner channel which have been evacuated of said fine granular substance after a period of self sustaining oscillation of said unit;

(o) placing sound damping material onto said inner channel at said resonant zones located in step (n);

11. A method as set forth in claim 7 wherein said housing has an inner channel and an outer channel and in which the method steps of claim 7 are used to locate and damp the resonant zones caused by acoustic feedback in said outer channel and then in said inner channel.

12. A method as set forth in claim 7 wherein said housing has an inner channel and an outer channel and in which the method steps of claim 7 are used to locate and damp the resonant zones caused by acoustic feedback first in said outer channel and then in said inner channel with the steps for said inner channel further comprising:

(f) replacing said sound damping material with different sound damping material having a slightly larger volume;

(g) increasing the gain of said output signal from said spring reverberation unit until said unit is driven to a state of self sustaining oscillation;

(h) measuring the level of gain necessary in step (g);

(i) repeating steps (f) through (h) with sound damping material having successively larger volumes until the sound damping material reaches a size which results in the maximum gain before incuding self-sustained oscillation of said spring reverberation unit and without adversely affecting the operation of said spring reverberation unit;

(j) placing said sound damping material having the size determined in step (i) at said locations determined in step (d).

13. A method for locating and damping resonant zones caused by acoustic feedback in a spring reverberation unit having a housing with an inner channel and an outer channel comprising for the outer channel the steps of:

(a) placing said spring reverberation unit in an environment so that acoustic pressure waves impact upon said unit causing an output signal from said unit;
(b) increasing the gain of said output signal from said spring reverberation unit until said unit is driven to a state of self sustaining oscillation;
(c) measuring the level of gain necessary in step (b);
(d) placing sound damping material onto said housing of said outer channel;
(e) increasing the gain of said output signal from said spring reverberation unit until said unit is again driven to a state of self sustaining oscillation;
(f) measuring the level of gain necessary in step (e);
(g) changing the location of said sound damping material on said housing of said outer channel of said spring reverberation unit;
(h) repeating steps (e), (f), and (g);
(i) placing said sound damping material at the location at which the level of gain of said output signal from said spring reverberation unit was greatest; and comprising for said inner channel the steps of:
(j) covering the surface of said housing of said inner channel with a fine granular substance;
(k) placing said spring reverberation unit in an environment so that acoustic pressure waves impact upon said unit causing an output signal from said unit;
(l) increasing the gain of said output signal from said spring reverberation unit until said unit is driven to a state of self-sustained oscillation;
(m) determining the resonant zones of said spring reverberation unit by locating those areas of said housing of said inner channel which have been evacuated of said fine granular substance after a period of self-sustaining oscillation ' of said unit;
(n) placing sound damping material on said housing of said inner channel at said resonant zones located in step (m).

14. The method as set forth in claim 13 further comprising for the outer channel the steps of:

(o) replacing said sound damping material with different sound damping material having a slightly larger volume;
(p) increasing the gain of said output signal from said spring reverberation unit until said unit is again driven to a state of self-sustaining oscillation;
(q) measuring the level of gain necessary in step (p);
(r) repeating steps (o) through (q) with sound damping material having successively larger volumes until the sound damping material reaches a size which results in the maximum gain before inducing self-sustained oscillation of said spring reverberation unit and without adversely affecting the operation of said spring reverberation unit;
(s) placing said damping material having the size determined in step (r) at said location where the level of the gain of said output signal from said spring reverberation unit was greatest as determined in step (i).

15. The method as set forth in claim 14 further comprising for the inner channel the steps of:

(t) replacing said sound damping material with different sound damping material having a slightly larger volume;
(u) increasing the gain of said output signal said spring reverberation unit until said unit is driven to a state of self sustaining oscillation;
(v) measuring the level of gain necessary in step (u);
(w) repeating steps (t) through (v) with sound damping material having successively larger volumes until the sound damping material reaches a size which results in the maximum gain before inducing self-sustained oscillation of said spirng reverberation unit and without adversely affecting the operation of said spring reverberation unit;
(x) placing said sound damping material having the size determined in step (w) at said locations determined in step (d).

16. The method as set forth in claim 13 further comprising for said inner channel the steps of:

(o) replacing said sound damping material with different sound damping material having a slightly larger volume;
(p) increasing the gain of said output signal from said spring reverberation unit until said unit is driven to a state of self-sustaining oscillation;
(q) measuring the level of gain necessary in step (p);
(r) repeating steps (o) through (q) with sound damping material having successively larger volumes until the sound damping material reaches a size which results in the maximum gain before inducing self-sustained oscillation of said spring reverberation unit and without adversely affecting the operation of said spring reverberation unit; (s) placing said sound damping material having the size determined in step (r) at said locations determined in step (d).

17. A method for locating and damping resonant zones caused by acoustic feedback in a spring reverberation system having a housing with an inner channel and an outer channel comprising for said outer channel the steps of:

(a) covering the surface of said outer channel with a fine granular substance;
(b) placing said spring reverberation unit in an environment so that acoustic pressure waves impact upon said unit causing an output signal from said unit;
(c) increasing the gain of said output signal from said spring reverberation unit until said unit is driven to a state of self sustaining oscillation;
(d) determining the resonant zones of said spring reverberation unit by locating those areas of said housing which have been evacuated of said fine granular substance after a period of self sustaining oscillation of said unit;
(e) placing sound damping material on said outer channel at said resonant zones located in step (d); and comprising for said inner channel the steps of:
(f) placing said spring reverberation unit in an environment so that acoustic pressure waves impact upon said unit causing an output signal from said unit;
(g) increasing the gain of said output signal from said spring reverberation unit until said unit is driven to a state of self sustaining oscillation;
(h) measuring the level of gain necessary in step (g);
(i) placing sound damping material onto said inner channel;
(j) increasing the gain of said output signal from said spring reverberation unit until said unit is again driven to a state of self sustaining oscillation;

(k) measuring the level of gain necessary in step (j);

(l) changing the location of said sound damping material on said inner channel of said spring reverberation unit;

(m) repeating steps (j), (k) and (l);

(n) placing said sound damping material at the location at which the level of gain of said output signal from said spring reverberation unit was greatest.

18. The method as set forth in claim 17 further comprising for said outer channel the steps of:

(o) replacing said sound damping material with different sound damping material having a slightly larger volume;

(p) increasing the gain of said output signal from said spring reverberation unit until said unit is driven to a state of self-sustaining oscillation;

(q) measuring the level of gain necessary in step (p);

(r) repeating steps (o) through (q) with sound damping material having successively larger volumes until the sound damping material reaches a size which results in the maximum gain before inducing self-sustained oscillation of said spring reverberation unit and without adversely affecting the operation of said spring reverberation unit;

(s) placing said sound damping material having the size determined in step (r) at said locations determined in step (d).

19. The method as set forth in claim 18 further comprisng for said inner channel the steps of:

(t) replacing said sound damping material with different sound damping material having a slightly larger area;

(u) increasing the gain of said output signal from said spring reverberation unit until said unit is again driven to a state of self sustaining oscillation;

(v) measuring the level of gain necessary in step (u);

(w) repeating steps (t) through (u) with sound damping material having successively larger areas until the area of the sound damping material reaches the desireable size;

(x) placing said damping material having the desirable size at said location where the level of the gain of said output signal from said spring reverberation unit was greatest as determined in step (n).

20. A method as set forth in claim 17 further comprising for said inner channel the steps of:

(o) replacing said sound damping material with different sound damping material having a slightly larger volume;

(p) increasing the gain of said output signal from said spring reverberation unit until said unit is driven to a state of self-sustaining oscillation;

(q) measuring the level of gain necessary in step (p);

(r) repeating steps (o) through (q) with sound damping material having successively larger volumes until the sound damping material reaches a size which results in the maximum gain before inducing self-sustained oscillation of said spring reverberation unit and without adversely affecting the operation of said spring reverberation unit;

(s) placing said sound damping material having the size determined in step (r) at said locations determined in step (d).

21. An improved spring reverberation unit comprising a housing having an inner channel and an outer channel, said inner channel being suspended within said outer channel by spring absorbing means, said inner channel having electro-mechanical transducing driver means and an electrical input terminal connected to said driver means, mechanical-electric transducing pickup means and an electrical output terminal connected to said pickup means, and at least one spring mechanically connected at one end to said driver means and at the other end to said pickup means, said driver means operating to move said spring in response to an audio frequency signal being present at said electrical input terminal, said spring transferring said energy along its length from said driver means to said pickup means, said pickup means generating an output signal on said electrical output terminal in response to said movement of said spring, wherein the improvement comprises:

sound damping material secured to said outer channel of said spring reverberation unit at the location of the resonance zones of said outer channel.

22. The improved spring reverberation unit of claim 21 wherein the shape of said sound damping material is sufficient to effectively reduce resonance of said spring reverberation unit caused by acoustic feedback.

23. The improved spring reverberation unit of claim 22 wherein said sound damping material comprises at least two pads of a resilient material secured at the location of said resonance zones of said outer channel.

24. The improved spring reverberation unit of claim 21 further comprising additional sound damping material secured to said inner channel at the locations of the resonance zones of said inner channel.

25. The improved spring reverberation unit of claim 24 wherein the shape of said inner channel sound damping material is sufficient to effectively reduce resonance of said spring reverberation unit caused by acoustic feedback.

26. The improved spring reverberation unit of claim 25 wherein said inner channels sound damping material comprises at least two pads of a resilient material secured at the location of the resonance zones of said inner channel.

27. Apparatus for locating resonance zones in a spring reverberation unit caused by acoustic feedback from an audio transducer means, said apparatus comprising:

a spring reverberation unit acoustically coupled to said audio transducer to produce an output signal due solely to the vibration of said unit caused by said audio transducer;

a variable gain circuit receiving the output of said reverberation unit and connected to said audio transducer;

means for increasing the gain of said variable gain circuit to drive said reverberation unit into self-sustaining oscillation; and, means for locating the resonance zones of said reverberation unit to provide the highest level of gain of said variable gain circuit before inducing self-sustaining oscillation of said spring reverberation unit.

28. Apparatus for locating resonance zones in a spring reverberation unit as set forth in claim 27 wherein said variable gain circuit comprises:

(a) a reference oscillator producing an initial voltage output signal;

(b) a precision divider circuit for receiving said initial voltage output signal and for providing a calibrated signal output;

(c) a variable gain circuit having an input terminal and an output terminal;

(d) switch means for alternatively connecting said calibrated signal output from said precision divider circuit or the output from said spring reverberation unit to said input terminal of said variable gain circuit.

* * * * *